(12) United States Patent
Steger

(10) Patent No.: US 7,480,974 B2
(45) Date of Patent: Jan. 27, 2009

(54) METHODS OF MAKING GAS DISTRIBUTION MEMBERS FOR PLASMA PROCESSING APPARATUSES

(75) Inventor: Robert J. Steger, Los Altos, CA (US)

(73) Assignee: Lam Research Corporation, Fremont, CA (US)

(*) Notice: Subject to any disclaimer, the term of this patent is extended or adjusted under 35 U.S.C. 154(b) by 146 days.

(21) Appl. No.: 11/057,433

(22) Filed: Feb. 15, 2005

(65) Prior Publication Data

US 2006/0180275 A1 Aug. 17, 2006

(51) Int. Cl.
*B23Q 17/00* (2006.01)
*C23F 1/00* (2006.01)

(52) U.S. Cl. .................. 29/407.05; 156/345.34
(58) Field of Classification Search .......... 29/407.05, 29/407.01, 428; 156/345.34, 345.29, 345.26, 156/345.24; 438/513; 118/715
See application file for complete search history.

(56) References Cited

U.S. PATENT DOCUMENTS

| | | | |
|---|---|---|---|
| 5,534,751 A | 7/1996 | Lenz et al. | |
| 5,583,737 A | 12/1996 | Collins et al. | |
| 5,715,132 A | 2/1998 | Steger et al. | |
| 5,998,932 A | 12/1999 | Lenz | |
| 6,073,577 A | 6/2000 | Lilleland et al. | |
| 6,090,304 A | 7/2000 | Zhu et al. | |
| 6,098,568 A * | 8/2000 | Raoux et al. | 118/723 E |
| 6,108,189 A | 8/2000 | Weldon et al. | |
| 6,391,787 B1 | 5/2002 | Dhindsa et al. | |
| 6,408,786 B1 | 6/2002 | Kennedy et al. | |
| 6,451,157 B1 | 9/2002 | Hubacek | |
| 6,464,843 B1 | 10/2002 | Wicker et al. | |
| 6,506,254 B1 | 1/2003 | Bosch et al. | |
| 6,527,911 B1 | 3/2003 | Yen et al. | |
| 6,620,520 B2 | 9/2003 | O'Donnell | |
| 6,780,787 B2 | 8/2004 | O'Donnell | |
| 6,805,952 B2 | 10/2004 | Chang et al. | |
| 6,830,622 B2 | 12/2004 | O'Donnell et al. | |

OTHER PUBLICATIONS

International Search Report and Written Opinion dated May 29, 2008 for PCT/US2006/004284.

* cited by examiner

*Primary Examiner*—John C Hong
(74) *Attorney, Agent, or Firm*—Buchanan Ingersoll & Rooney PC

(57) ABSTRACT

Methods for making gas distribution members for plasma processing apparatuses are provided. The gas distribution members can be electrodes, gas distribution plates, or other members. The methods include fabricating gas injection holes in a gas distribution member by a suitable technique, e.g., a mechanical fabrication technique, measuring gas flow through the gas distribution member, and then adjusting the permeability of the gas distribution member by the same fabrication technique, or by a different technique, e.g., laser drilling. The permeability of the gas distribution member can be adjusted at one or more zones of the member.

17 Claims, 3 Drawing Sheets

METHODS OF MAKING GAS DISTRIBUTION MEMBERS FOR PLASMA PROCESSING APPARATUSES

BACKGROUND

Plasma processing apparatuses for processing semiconductor substrates, such as semiconductor wafers, can include a gas distribution member having holes through which gas is flowed into a plasma processing chamber. For example, the gas distribution member can be a showerhead electrode positioned in the chamber to distribute process gas over a surface of a semiconductor substrate being processed in the chamber.

SUMMARY

Methods for making gas distribution members for plasma processing apparatuses and gas distribution members are provided. A preferred embodiment of the methods includes fabricating gas injection holes in a gas distribution member, measuring gas flow through the gas distribution member, and then adjusting the permeability of the gas distribution member so that it can provide a desired gas flow distribution.

The gas distribution members can be showerhead electrodes, gas distribution plates, baffles, or other members used for introducing gas into plasma processing chambers.

A preferred embodiment of the methods of making a gas distribution member for a plasma processing apparatus comprises fabricating gas injection holes to extend between inlet and outlet surfaces of the gas distribution member. Gas is flowed through the gas injection holes and the total gas flow that exits therefrom at the outlet surface for each of a plurality of zones of the gas distribution member is measured. Based on the total gas flows measured for each of the zones, the gas permeability of the gas distribution member can be adjusted at one or more of the zones to achieve a desired gas flow distribution pattern at the outlet surface.

In a preferred embodiment, the gas permeability of a gas distribution member can be adjusted by determining the highest total gas flow through a first one of the zones of the member; determining the difference between the highest total gas flow and the total gas flow through at least a second one of the zones; and, at the second zone, modifying at least one gas injection hole to increase gas flow through the hole and/or fabricating at least one additional gas injection hole.

Another preferred embodiment of the methods of making a gas distribution member for a plasma processing apparatus comprises adjusting the gas permeability of the gas distribution member by determining the difference between a desired total gas flow and the measured total gas flows through a plurality of zones of the member; and, at one or more of the zones, modifying at least one gas injection hole to increase gas flow through the hole and/or fabricating at least one additional gas injection hole.

In a preferred embodiment, after the permeability adjustment to the gas distribution member has been made, the gas flow through the gas distribution member can be measured to confirm the permeability adjustment has been satisfactory.

A preferred embodiment of a method of adjusting the permeability of a gas distribution member for a plasma processing apparatus comprises flowing a gas through gas injection holes of the member, and measuring the total gas flow that exits from the gas injection holes at different zones of the member. Based on the total gas flows for each of the zones, the gas permeability at one or more of the zones of the gas distribution member can be adjusted.

A preferred embodiment of a gas distribution member for a plasma processing apparatus comprises mechanically-formed gas injection holes and one or more laser-drilled gas injection holes. The gas distribution member includes an outlet surface at which gas exits from the gas injection holes. In an embodiment, the gas distribution member can provide a substantially uniform gas flow distribution pattern across the surface. In another embodiment, the gas distribution member can provide a desired non-uniform gas flow distribution pattern across the surface.

BRIEF DESCRIPTION OF THE DRAWING FIGURES

DETAILED DESCRIPTION OF PREFERRED EMBODIMENTS

Figure 1:
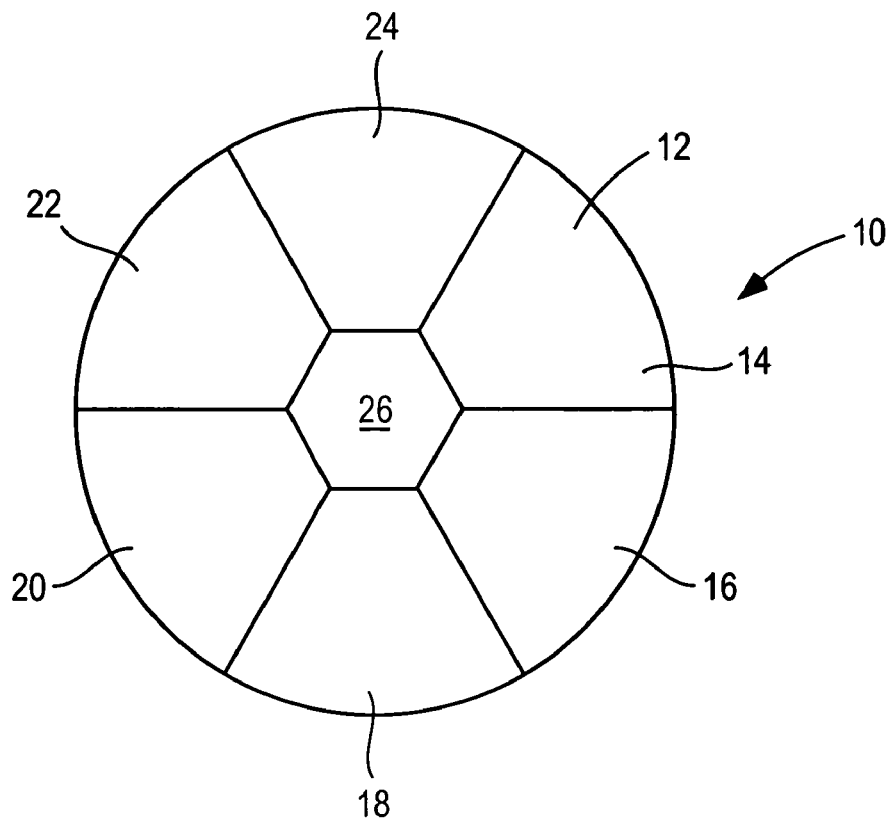
FIG. 1 shows a gas outlet surface of a gas distribution member that has seven zones.

Plasma processing apparatuses can include a gas distribution member, such as a showerhead electrode or a gas distribution plate, through which process gas is flowed into the plasma processing chamber. For example, parallel-plate plasma processing chambers, such as capacitively-coupled chambers, can include a showerhead upper electrode and a lower electrode. The bottom or outlet surface of the upper electrode is exposed to plasma and typically faces a substrate support on which a semiconductor substrate is supported during processing operations. During plasma processing, e.g., etching or deposition processes, plasma is formed in the region between the electrodes by energizing process gas by applying power to the electrodes.

Showerhead electrodes include gas injection holes having outlets arranged across their bottom surface to distribute process gas over the surface of the substrate that is being processed. The gas injection holes can be fabricated by mechanical hole fabrication techniques, such as mechanical drilling techniques that use abrasive slurries. Such techniques typically have a maximum precision of about ±0.003 inch. This level of precision can result in regions of the gas distribution member having undesirable differences in their gas flow properties with respect to other regions, which in turn can detrimentally affect the process rate uniformity across semiconductor substrates that are processed using the gas distribution member, e.g., substrate etch rate uniformity.

Another hole fabrication technique that can be used to form gas injection holes in gas distribution members, such as showerhead electrodes, is laser drilling. Laser drilling can be used to fabricate gas injection holes with a higher level of precision than mechanical hole fabrication techniques. However, laser drilling is significantly more expensive per hole formed than mechanical drilling, e.g., laser drilling can be more than ten times the cost of mechanical drilling. As showerhead electrodes typically include hundreds of gas injection holes, the total cost of forming every gas injection hole of a showerhead electrode by laser drilling may be prohibitively high.

In addition, showerhead electrodes are consumable parts and, accordingly, are replaced periodically. It is desirable to decrease the total production cost of showerhead electrodes, as well as that of other consumable gas distribution members, in order to decrease their replacement cost. Thus, it is desirable to provide economical methods of fabricating arrangements of gas injection holes in gas distribution members. It is further desirable that such members can be used to distribute process gas in a desired flow distribution pattern into a plasma processing chamber.

Accordingly, methods of making gas distribution members for plasma processing apparatuses are provided. In a preferred embodiment, all of the gas injection holes are fabricated in a gas distribution member using the same technique. For example, a mechanical hole fabrication can be used to fabricate all of the gas injection holes in the gas distribution member. In the embodiment, the major portion of the gas injection holes are fabricated in a desired pattern in the gas injection member by a mechanical hole fabrication technique. Then, the gas permeability of the gas injection member is adjusted at one or more selected zones of the member using the mechanical fabrication technique to achieve a desired final gas injection hole pattern. As explained below, the locations of the gas injection member at which the gas permeability is adjusted can be determined by measuring gas flow through the initially-fabricated gas injection holes and then adjusting the permeability of the member at one or more zones based on the measured gas flow values.

As used herein, the "permeability" of the gas distribution member, or of a zone of the member, can be characterized by the total, or composite, gas flow through the gas injection holes across the entire outlet surface of the member, or through the gas injection holes of the zone, respectively, when gas is flowed through the gas injection holes. For example, the total gas flow through the gas distribution member, or through a zone of the member, can be represented by a volumetric flow rate measured in conventional units, such as sccm.

In another preferred embodiment, a mechanical hole fabrication technique is used to form the major portion of the total gas injection holes in the gas distribution member. Then, a more precise technique, e.g., laser drilling, is used to adjust the permeability of the gas distribution member at one or more zones of the member.

Accordingly, preferred embodiments of the methods can utilize an economical hole fabrication technique to fabricate the major portion of the total gas injection holes, and then make adjustments to the gas injection hole pattern using the same technique, or a different technique, to produce gas distribution members adapted to provide desired gas flow distribution patterns in a plasma processing chamber. The permeability of the gas distribution member can be adjusted by modifying one or more of the mechanically-formed holes and/or fabricating one or more additional gas injection holes in the gas distribution member.

The gas distribution member can be a showerhead electrode, which can be either grounded or powered in the plasma processing chamber during plasma processing. In another preferred embodiment, the gas distribution member can be a gas distribution plate, e.g., a baffle. The gas distribution member is preferably a new part (i.e., a gas distribution member that has not been used for plasma processing). Alternatively, the gas distribution member can be a used part.

The gas distribution member can be of any suitable material for use in a plasma processing chamber, including, for example, single crystal silicon, polysilicon, amorphous silicon or silicon carbide. A metallic material, such as aluminum or an aluminum alloy can be used for making gas distribution members that are not exposed to plasma in the plasma processing chamber. Metallic gas distribution members, such as baffle plates mounted in baffle chambers, can have a silicon-coated surface that is exposed to plasma. An exemplary electrode assembly and silicon-containing baffle plate arrangement is described in commonly-assigned U.S. Pat. No. 6,451,157, which is incorporated herein by reference in its entirety.

The gas injection holes formed in the gas distribution member, e.g., a showerhead electrode, are typically round holes, which typically can have a diameter of from about 0.005 inch to about 0.05 inch. The total number of gas injection holes in the gas distribution member is typically in the hundreds, e.g., up to 600 holes or more.

The gas injection holes can have other suitable cross-sectional shapes, e.g., tapered shapes or slotted shapes. Gas injection holes having different shapes from each other, e.g., round holes and tapered or slotted holes, can be provided in the same gas distribution member.

A preferred embodiment of the methods of making gas distribution members for plasma processing apparatuses comprises fabricating gas injection holes in a gas distribution member having an outlet surface at which gas exits from the gas injection holes. The outlet surface of the gas distribution member can optionally be divided into zones, which each include gas injection holes. Then, gas is flowed through the gas injection holes and the total gas flow exiting through the outlet surface of the member through each of the zones is measured. Based on the gas flow measurements for the individual zones, the permeability of the gas distribution member can be adjusted at one or more of the zones. The permeability of a zone can be adjusted relative to the permeability of another zone, e.g., the zone having the highest total gas flow. Alternatively, the permeability of a zone can be adjusted relative to a desired permeability value, e.g., a process design value that provides a desired gas flow distribution pattern for a plasma processing operation.

The permeability of the gas injection member is adjusted at a given zone by fabricating one or more additional gas injection holes, or by modifying at least one gas injection hole to thereby increase gas flow through the hole, such as by increasing the size of one or more of the holes, i.e., increasing the cross-sectional flow area along at least a portion of the length of the hole (e.g., at the outlet portion of the hole). The adjustment can be made using the same technique that is used to form the initial gas injection holes, e.g., a mechanical fabrication technique, or by using a different fabrication technique, e.g., laser drilling.

In a preferred embodiment of the methods of fabricating gas distribution members, gas injection holes are fabricated in a showerhead electrode of silicon or silicon carbide, using a mechanical fabrication technique. Typically, hundreds of gas injection holes are formed in the electrode by this technique. FIG. 1 shows a bottom surface of an embodiment of a showerhead electrode 10. The showerhead electrode 10 has a round plate configuration and includes gas injection holes (not shown) that extend through the thickness of the electrode, i.e., in the direction perpendicular to the surface. The showerhead electrode 10 can have a diameter suitable for processing wafers of, e.g., a 200 mm or 300 mm diameter. The gas injection holes can be arranged in any desired pattern in the showerhead electrode, e.g., in a pattern of concentric circles.

The outlet surface 12 of the showerhead electrode 10 can optionally be spatially divided (or mapped) into zones 14, 16, 18, 20, 22, 24 surrounding a central zone 26. For example, a template of the pattern of the zones can be made, where the zones preferably encompass the entire outlet surface 12 of the showerhead electrode 10, as shown in FIG. 1. As described in greater detail below, gas is preferably flowed through each of the zones to determine the permeability of each zone.

Figure 2:
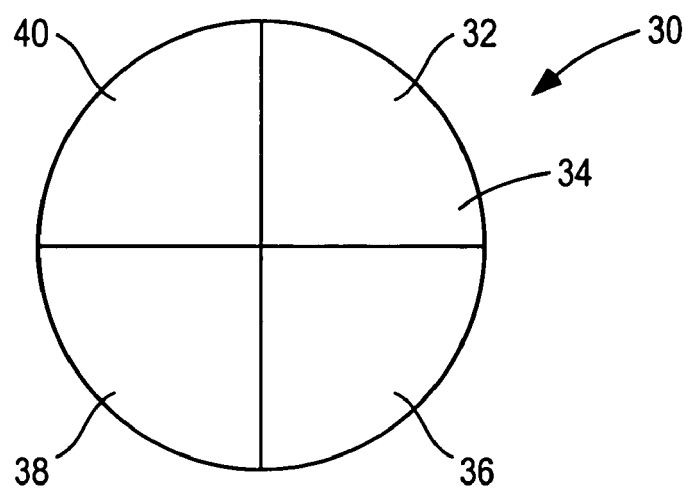
FIG. 2 shows a gas outlet surface of a gas distribution member that has four zones.

For a showerhead electrode or other gas distribution member, the size, shape and number of zones can be varied. For example, the showerhead electrode 10 can be divided into more or less zones than shown in FIG. 1, e.g., from about 2 to about 24 zones, depending on the desired ultimate electrode performance in service. By increasing the number of zones, the uniformity of the gas flow exiting the gas injection holes across the outlet surface can be enhanced. FIG. 2 shows another preferred embodiment of a showerhead electrode 30 including an outlet surface 31 that is divided into four zones 32, 34, 36, 38, which each have about the same size and shape.

Figure 3:
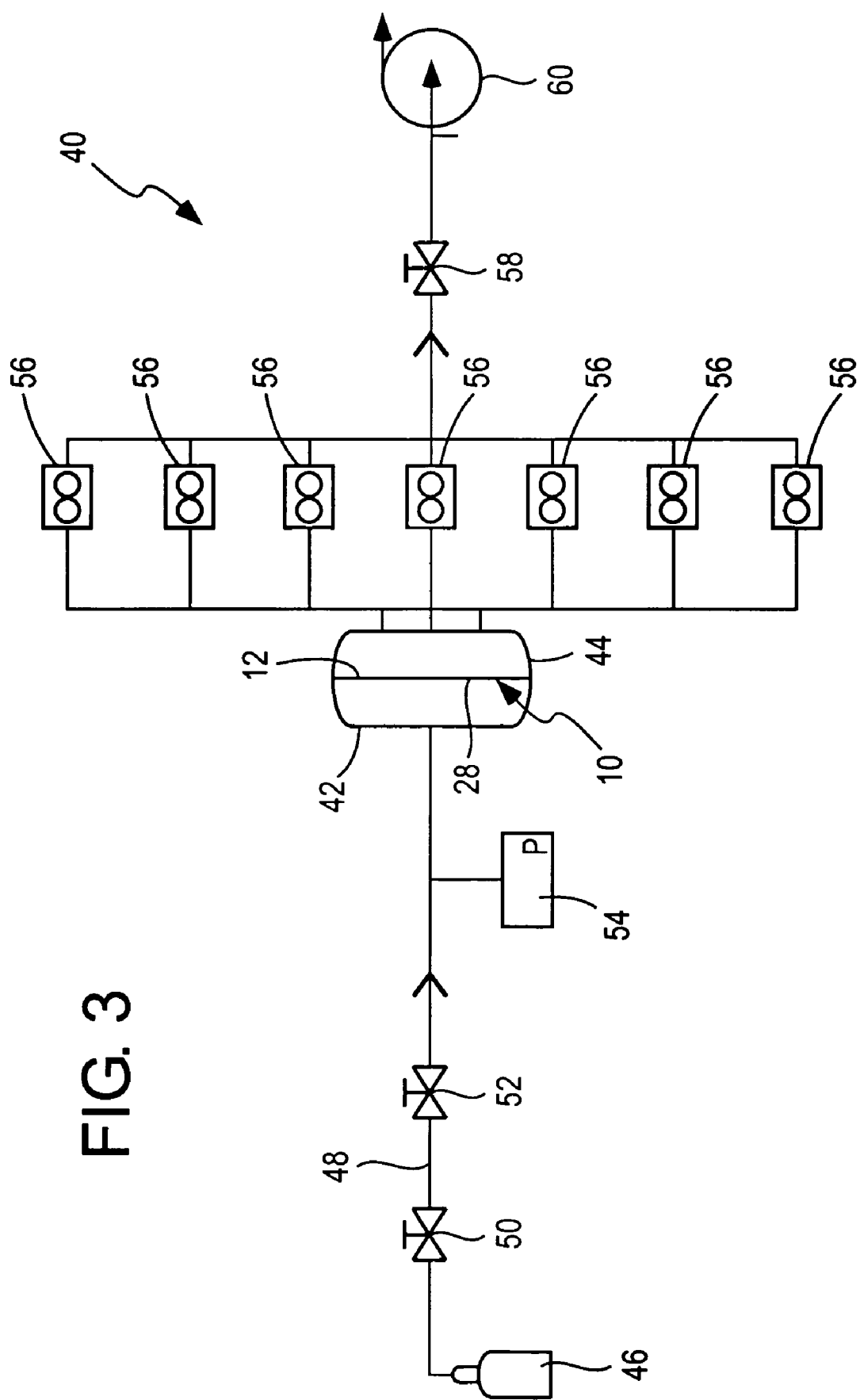
FIG. 3 shows an embodiment of a gas flow measurement apparatus adapted to measure gas flow through the zones of a gas distribution member.

In the embodiment, gas flow through the showerhead electrode 10 can be measured in the following exemplary manner. The showerhead electrode 10 is mounted in a gas flow measurement apparatus 40 adapted to measure gas flow through each of the zones 14-26. FIG. 3 shows an exemplary embodiment of a gas flow measurement apparatus 40 including two plenums 42, 44. The plenum 42 is configured to seal to the periphery of the inlet surface 28, and the plenum 44 is configured to seal to the periphery of the outlet surface 12 of the showerhead electrode 10. Both plenums 42, 44 preferably have a round outer shape with a diameter approximating the diameter of the showerhead electrode 10 in order to maximize the surface area of the showerhead electrode 10 over which gas flow is measured.

The plenum 42 is connected to a gas supply system, which comprises a gas source 46, a gas line 48, a shutoff valve 50, a flow control valve 52 and a pressure sensor 54.

The number, shape and size of the individual zones of the plenum 44 correspond to the number, shape and size of the zones for which gas flow is to be measured on the showerhead electrode 10. Accordingly, for the showerhead electrode 10 shown in FIG. 1, the plenum 44 includes seven zones having the shape and the size of the zones 14-26 of the showerhead electrode 10. The zones of the plenum 44 can be defined by dividing walls that extend in a direction perpendicular to the outlet surface 12 of the showerhead electrode 10. Each zone of the plenum 44 preferably is sealed from the other zones, as well as from the ambient atmosphere, to enable the total gas flow to be accurately measured through each individual zone.

Each of the zones of the showerhead electrode 10 is preferably separately connected to a respective flow measuring device 56. The outputs of the flow measuring devices 56 are preferably collectively connected to a shutoff valve 58 and a vacuum pump 60. This arrangement allows a desired gas flow and inlet gas pressure to be applied to the showerhead electrode 10. The gas flow and pressure conditions used for testing are preferably similar to typical operating conditions that are applied during plasma processing of semiconductor substrates using the showerhead electrode 10.

In an embodiment, in order to measure the gas flow exiting through the zones of the showerhead electrode 10 via the zones of the plenum 44, the vacuum pump 60 is activated and the valve 58 is opened, such that the plenums 42, 44 and showerhead electrode 10 are evacuated. Upon reaching a desired vacuum level, the flow measuring devices 56 are verified to be at zero flow.

The shutoff valve 50 is opened to allow gas to flow from the gas source 46 into the plenum 42, and the gas flow is adjusted with the flow control valve 52 to obtain a pressure reading on the pressure sensor 54, which is comparable to typical operating conditions that are used for the showerhead electrode 10. The system is stabilized and the gas flows through the individual zones are measured, either individually or simultaneously, by the flow measuring devices 56. The flows are preferably recorded, either manually or electronically.

In a preferred embodiment, the gas flow measurement apparatus 40 can be electrically connected to a controller that is in control communication with any selected ones of the shutoff valve 50, flow control valve 52, pressure sensor 54, flow measuring devices 56, shutoff valve 58 and vacuum pump 60. The controller can read values from the pressure sensor 54 and flow measuring devices 56 and control operation of the valves. The controller also can perform numerical calculations utilizing the measured values.

After the gas flows through the individual zones of the showerhead electrode 10 have been measured, the showerhead electrode 10 can be removed from the gas flow measurement apparatus 40. Based on the total gas flow values through the individual zones, it can be determined whether it is desirable to adjust the permeability of any of the zones to achieve a desired gas flow distribution pattern at the outlet surface 12 of the electrode 10. For example, the individual total gas flow values for the zones can be compared to each other to determine the highest measured total gas flow value. For the zones that have a smaller total gas flow value than the highest measured value, the permeability of one or more of those zones can be adjusted to allow the zone(s) to provide a total gas flow that is/are preferably substantially equal to the highest measured value.

In other embodiments, it may be desirable to provide a higher gas permeability at different zones of the gas distribution member, e.g., at zones defining the periphery, or at the central portion of the gas distribution member, so that gas can be distributed in a desired flow pattern over the processed surface of a substrate.

In another embodiment, the individual total gas flow values for the zones can be compared to a desired value, e.g., a predetermined value. If none of the measured total gas flow values exceed the desired value, then the permeability of the one or more zones can be adjusted relative to the desired value to achieve a desired gas flow distribution pattern. If one or more of the measured total gas flow values for the zones exceeds the desired value, then the permeability of one or more of those zones can be adjusted relative to highest measured value, or to the desired value. In such embodiments, it may be desirable for the gas distribution member to have a higher gas permeability at one or more selected zones, e.g., at the periphery or the central portion of the gas distribution member, so that process gas can be distributed in a desired flow distribution pattern over the processed surface of a substrate.

After the permeability of one or more zones of the gas distribution member has been adjusted by machining, gas flow though the zones can be re-measured in the gas flow measurement apparatus 40 to confirm that the permeability adjustment has provided the desired total gas flows through the zones. If it is determined that additional machining of the gas distribution member may be desirable, the gas distribution member can be machined at one or more selected zones according to the procedures described above, so as to either modify one or more gas injection holes, and/or form one or more additional gas injection holes. This procedure can be repeated, as desired, until the desired gas flow performance of the gas distribution member is achieved.

In an exemplary embodiment, equal predetermined total gas flows, $Q_o$, can be denoted for each of the zones of the showerhead electrode 10. The actual total gas flow measured in a zone j is denoted as $Q_j$. For each zone, the difference between the predetermined flow and the actual flow, $\Delta Q_j$, can be calculated, i.e., $\Delta Q_j = Q_o - Q_j$.

In the embodiment, it is preferred to maintain the gas flow rate per unit hole cross-sectional area for a zone, i.e., the ratio $Q_j/A_j$, where A is the nominal total hole cross-sectional flow area of the zone, and Q is the total gas flow for the zone. Using the relation $Q_j/A_j=\Delta Q_j/\Delta A_j$, the cross-sectional flow area, $\Delta A_j$, that can be added to a selected zone to achieve a desired total cross-sectional flow area for that zone can be calculated. The desired cross-sectional flow area $\Delta A_j$ can be added to a zone by increasing the cross-sectional flow area of one or more existing holes, or by adding one or more additional holes in the zone. As described above, using a fabrication method, such as mechanical drilling, ultrasonic drilling, or laser drilling, the size of one or more holes can be adjusted such that the cross-sectional flow area of the one or more holes is increased by an amount $\Delta A_j$, or one or more holes having a total cross-sectional flow area equal to $\Delta A_j$ can be added.

EXAMPLE 1

An exemplary showerhead electrode includes seven zones, each zone including 240 holes each with a nominal diameter of 0.025 inches. $A_j$ equals 0.118 in$^2$ for each zone. The holes can be formed by any suitable fabrication technique. Assuming a predetermined flow value of 36.1 sccm, $A_j/Q_j$ equals $3.263\times10^{-3}$ in$^2$/sccm.

Gas is flowed through the gas injection holes of the zones and the measured total gas flow values for the zones are shown in Table 1. Table 1 also shows calculated hole diameters that can be added to the respective zones such that each of the zones has the same total cross-sectional flow area. Zone 6 has the highest measured total gas flow $Q_j$. Accordingly, the cross-sectional flow area of each of the remaining zones 1-5 and 7 can be adjusted relative to that of zone 6 by adding one or more holes having a total diameter shown in Table 2 to each of the zones 1-5 and 7. For example, in zone 1, a single additional hole having a diameter of 0.018 inch can be fabricated by any suitable fabrication technique. In zone 7, a single additional hole having a desired diameter of 0.044 inch, or two additional holes each having a desired diameter of 0.022 inch can be fabricated.

TABLE 1

| Zone | Flow $Q_j$ | Desired Flow $Q_j$ | $\Delta Q_j$ | $A_j/Q_j \times \Delta Q$ | Hole Dia. (in.) |
|---|---|---|---|---|---|
| 1 | 35.8 | 36.1 | 0.3 | 0.0010 | 0.018 |
| 2 | 34.7 | 36.1 | 1.4 | 0.0046 | 0.038 |
| 3 | 34.6 | 36.1 | 1.5 | 0.0049 | 0.039 |
| 4 | 35.3 | 36.1 | 0.8 | 0.0026 | 0.029 |
| 5 | 34.3 | 36.1 | 1.8 | 0.0059 | 0.043 |
| 6 | 36.1 | 36.1 | 0 | 0 | none |
| 7 | 34.2 | 36.1 | 1.9 | 0.0062 | 0.044 |

EXAMPLE 2

This example describes the effects of error in the size of gas injection holes fabricated in a gas distribution member on gas flow through the gas distribution member. For a given hole, the error is given by the difference between the desired hole size, e.g., the diameter for round holes, and the actual hole size. The actual total gas flows for each zone of a gas distribution member can be individually measured and the difference between the highest total gas flow value for one of the zones, or the desired total gas flow for one or more zones, e.g., a predetermined total gas flow value, and the actual measured total gas flow value for that zone can be determined. From this difference, an additional cross-sectional flow area, $\Delta A_j$, that can be added in a selected zone to increase the total gas flow of this zone to the highest value or to the desired value can be determined.

As described above, in order to provide the additional cross-sectional flow area in a zone, an additional hole can be fabricated in the zone by any suitable technique, such as mechanical drilling, ultrasonic drilling or laser drilling. Assuming an error associated with the particular hole fabrication technique that is used to form the hole, the actual diameter of the additional hole differs from the calculated diameter. The effect of the error in hole size of the added hole on the accuracy of the flow correction for the zone resulting from adding the hole can be estimated in the following manner.

Assume $A_x$ is the sum of the actual hole cross-sectional flow areas (measured perpendicular to the direction of the axis of the hole) in zone x. The additional cross-sectional hole area to increase the flow level of zone x to the desired flow level is $\Delta A$. Assuming that one round hole of radius, r, is added to zone x to achieve this correction, then:

$$\Delta A = \pi r^2 \quad (1)$$

Denoting the error in the zone cross-sectional flow area (resulting from adding the hole with a diameter error as $\epsilon A$), and denoting the error in the radius of the added hole as $\delta$, gives:

$$|\pi(r+\delta)^2 - \Delta A| \leq \epsilon A \quad (2)$$

Expanding, rearranging, using Equation (1), and dropping the $\delta^2$ term (as being insignificant) gives:

$$\left|\frac{2\pi r \delta}{A}\right| < \epsilon \quad (3)$$

Assuming that zone x has n holes, each with a radius $r_0$, the total cross-sectional flow area A for the n holes equals $n\pi r_0^2$. Combining Equations (1) and (3) gives the following equation, where $\epsilon$ is the resulting flow error:

$$\left|\frac{2r\delta}{nr_0^2}\right| < \epsilon \quad (4)$$

Equation 4 indicates that the error in the cross-sectional flow area for zone x that results from adding a hole with a size error $\delta$ is directly proportional to $\delta$, and inversely proportional to the number of holes, n, in the zone and the square of the radius $r_0$ of the existing holes. Accordingly, for a given value of $\delta$ and n holes, increasing the hole radius, $r_0$, decreases the resulting flow error, $\epsilon$, for the zone resulting from adding the hole.

In an exemplary embodiment, assume that $r_0=0.0125$ inch and $r=0.020$ inch, and vary n and $\delta$. The calculated results are shown in Table 2.

TABLE 2

| Total number of holes in zone (n) | Error in radius size of additional hole ($\delta$) (inch) | Resulting flow error for zone ($\epsilon$) (%) |
|---|---|---|
| 100 | 0.001 | 0.26 |
| 100 | 0.005 | 1.3 |
| 40 | 0.001 | 0.64 |
| 40 | 0.005 | 3.2 |

As shown in Table 2, for a given value of δ, increasing the total number of holes in a zone of the gas distribution member decreases the resulting flow error ε for the for a given hole size error. In other words, by increasing the total number of holes in the zone that is sufficient to achieve a desired gas flow, the preciseness of the size of additional holes that can still achieve a given overall flow error is reduced. Accordingly, a less-precise hole fabrication technique, such as mechanical drilling, may be suitable for fabricating additional holes with a desired overall flow error for one or more of the zones. For example, one or more additional holes may be fabricated in a zone having 100 holes by mechanical drilling, while a more precise fabrication technique, such as laser drilling, may be desirable for fabricating one or more additional holes in a zone having only 40 holes. In order to reduce the flow error associated with an added hole, the number of holes in a zone can be increased such that ΔA added by the hole is not large relative to the total cross-sectional area of the holes in the zone.

As also shown in Table 2, for a value of δ of 0.001 inch and 100 holes, the value of ε resulting from the error in the hole diameter is 0.26% of the ideal flow. For a radial error of 0.005 inch for the added hole (i.e., a diametric error of 0.010), the flow error for the zone is only 1.3%. The calculations further indicate that for a readily-achievable added hole diametric error of 0.005 inch, a 40-hole zone can be corrected within an error of about 3% (i.e., δ=0.0025 inch and ε=0.016).

Figure 4:
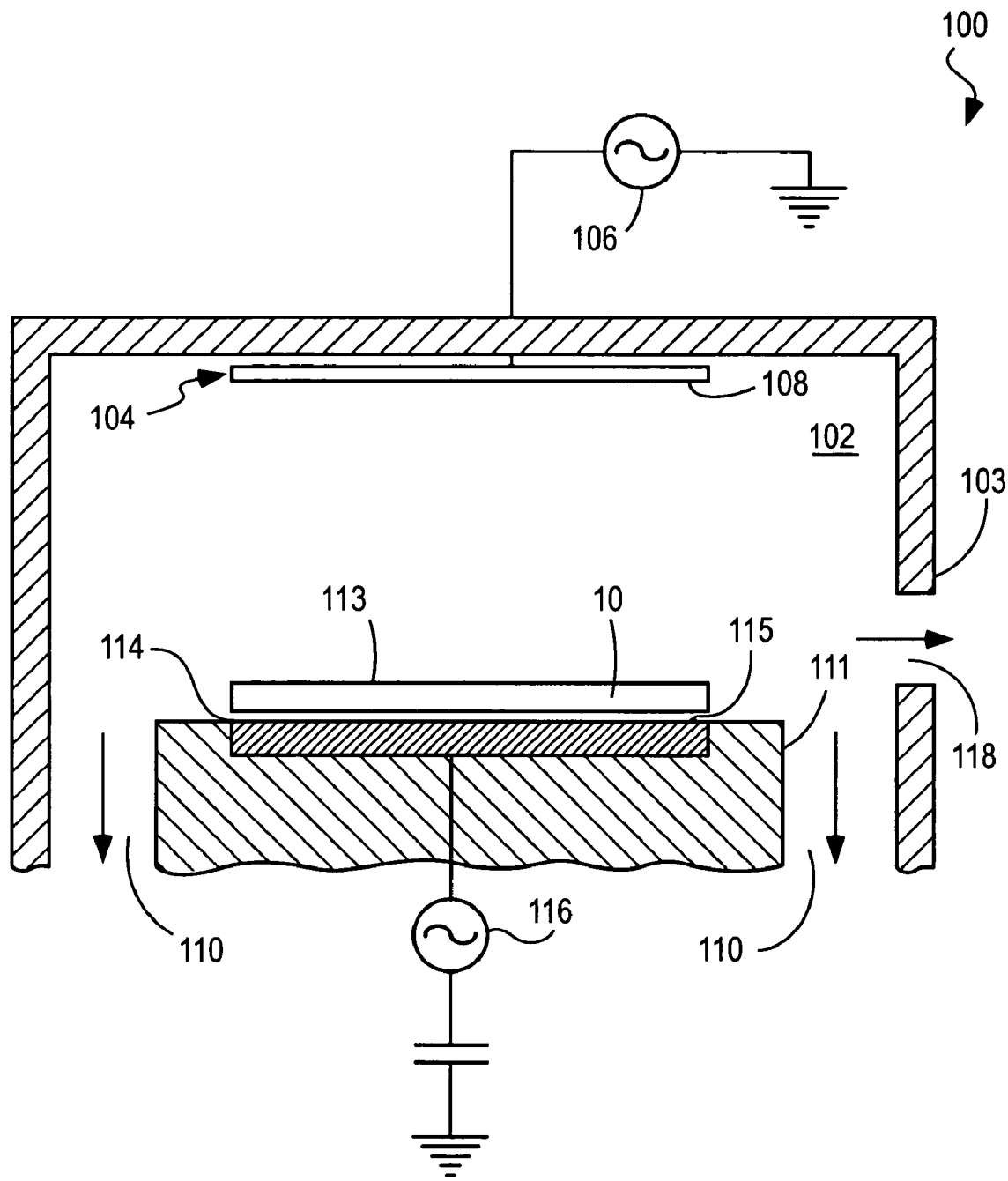
FIG. 4 shows an embodiment of a plasma processing apparatus including a showerhead electrode.

FIG. 4 depicts an exemplary plasma processing apparatus 100 that comprises a capacitively-coupled plasma processing chamber 102, which can generate a medium-density plasma. The plasma processing chamber 102 includes a chamber wall 103. To provide an electrical path to ground, the chamber wall 103 can be made of aluminum or the like and electrically grounded.

The plasma processing apparatus 100 can include components, such as chamber walls, liners and the like, made of protective materials and/or that include protective coatings, that are resistant to erosion and corrosion during plasma processing. Exemplary components are described, for example, in commonly-assigned U.S. Pat. Nos. 6,408,786; 6,464,843; 6,506,254; 6,620,520; 6,780,787; 6,805,952 and 6,830,622, each of which is incorporated herein by reference in its entirety.

The plasma processing chamber 102 includes a wafer transfer slot 118 provided in the chamber wall 103 to transfer semiconductor substrates into and out of the plasma processing chamber 102.

The plasma processing chamber 102 includes an upper electrode 104 having a bottom surface 108. The bottom surface 108 can be flat or can include a step, as described, in U.S. Pat. No. 6,391,787, which is incorporated herein by reference in its entirety. The upper electrode 104 can be a single-piece, or multi-piece electrode. The upper electrode 104 can be a showerhead electrode including gas passages for distributing process gas into the plasma processing chamber. The upper electrode can be of silicon (e.g., single crystal silicon, polycrystalline silicon or amorphous silicon) or silicon carbide. The apparatus 100 includes a gas source (not shown) for supplying process gas to the upper electrode 104.

The upper electrode 104 can be provided in an elastomer-bonded electrode assembly as described in commonly-assigned U.S. Pat. No. 6,073,577, which is incorporated herein by reference in its entirety.

The upper electrode 104 is preferably powered by an RF power source 106 via a matching network. In another embodiment, the upper electrode 104 can be grounded to provide a return path for power supplied by a bottom electrode of the plasma processing chamber 102, as described below.

The apparatus 100 can include a plasma confinement ring assembly to confine plasma in a selected region of the plasma chamber. Suitable assemblies are described, for example, in U.S. Pat. Nos. 5,534,751; 5,998,932 and 6,527,911, each of which is incorporated herein by reference in its entirety.

In the embodiment of the apparatus 100 shown in FIG. 1, process gas is supplied into the plasma processing chamber 102 at the plasma region developed between the upper electrode 104 and a semiconductor substrate 10, e.g., a silicon wafer, supported on a substrate support 111. The substrate support 111 preferably includes an electrostatic chuck 114 that secures the semiconductor substrate 10 on the substrate support by an electrostatic clamping force. The electrostatic chuck 114 acts as a bottom electrode and is preferably biased by an RF power source 116 (typically via a matching network). The upper surface 115 of the electrostatic chuck 114 preferably has approximately the same diameter as the semiconductor substrate 10.

A pump (not shown) is adapted to maintain a desired vacuum pressure inside the plasma processing chamber 102. Gas is drawn by the pump generally in the direction represented by arrows 110.

An exemplary parallel-plate plasma reactor that can be used is a dual-frequency plasma etch reactor (see, e.g., commonly-assigned U.S. Pat. No. 6,090,304, which is hereby incorporated by reference in its entirety). In such reactors, etching gas can be supplied to a showerhead electrode from a gas supply and a plasma can be generated in the reactor by supplying RF energy from two RF sources to the showerhead electrode and/or a bottom electrode, or the showerhead electrode can be electrically grounded and RF energy at two different frequencies can be supplied to the bottom electrode.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method of making a gas distribution member for a plasma processing apparatus, comprising:
    fabricating gas injection holes which extend between opposed inlet and outlet surfaces of the gas distribution member;
    measuring a total gas flow that exits from the gas injection holes at the outlet surface for each of a plurality of zones of the gas distribution member; and
    based on the total gas flows measured for each of the zones, adjusting gas permeability of the gas distribution member at one or more of the zones to achieve a desired gas flow distribution pattern at the outlet surface.

2. The method of claim 1, wherein the gas distribution member is a showerhead electrode of silicon or silicon carbide.

3. The method of claim 1, wherein the gas distribution member is a gas distribution plate.

4. The method of claim 1, wherein, after the adjusting, each of the zones have substantially the same gas permeability such that the gas distribution member can provide a substantially uniform gas flow distribution pattern at the outlet surface.

5. The method of claim 1, wherein, after the adjusting, at least two of the zones have different gas permeabilities from each other.

6. The method of claim 1, wherein the gas injection holes are fabricated by a mechanical fabrication technique.

7. The method of claim 1, wherein at least two of the gas injection holes have different cross-sectional shapes from each other.

8. The method of claim 1, wherein the adjusting of the gas permeability of the gas distribution member comprises:
   determining the difference between the highest total gas flow through a first one of the zones and the total gas flow through at least a second one of the zones; and
   in the second zone, (i) modifying at least one gas injection hole to thereby increase gas flow through the modified gas injection hole and/or (ii) fabricating at least one additional gas injection hole, to thereby adjust the gas permeability of the second zone relative to that of the first zone.

9. The method of claim 8, wherein the fabrication technique used for (i) and/or (ii) is determined based on the total number of holes in the second zone.

10. The method of claim 1, wherein the adjusting of the gas permeability of the gas distribution member comprises:
    determining the difference between a desired total gas flow and the measured total gas flows through each of the zones; and
    at each of the one or more zones, (i) modifying at least one gas injection hole to thereby increase gas flow through the modified gas injection hole and/or (ii) fabricating at least one additional gas injection hole, to thereby adjust the gas permeability of the one or more zones based on the desired total gas flow.

11. The method of claim 10, wherein the fabrication technique used for (i) and/or (ii) is determined based on the total number of holes in the one or more zones.

12. A method of adjusting gas permeability of a gas distribution member for a plasma processing apparatus, comprising:
    flowing gas through gas injection holes of a gas distribution member such that the gas exits at an outlet surface of the gas distribution member;
    measuring a total gas flow that exits from the gas injection holes for each of a plurality of zones of the gas distribution member; and
    based on the total gas flows measured for each of the zones, adjusting the gas permeability of the gas distribution member at one or more of the zones to achieve a desired gas flow distribution pattern at the outlet surface.

13. The method of claim 12, wherein the gas distribution member is a showerhead electrode of silicon or silicon carbide.

14. The method of claim 12, wherein the adjusting of the gas permeability of the gas distribution member comprises:
    determining the difference between the highest total gas flow through a first one of the zones and the total gas flow through at least a second one of the zones; and
    in the second zone, (i) modifying at least one gas injection hole to thereby increase gas flow through the modified gas injection hole and/or (ii) fabricating at least one additional gas injection hole, to thereby adjust the gas permeability of the second zone relative to the gas permeability of the first zone.

15. The method of claim 14, wherein the fabrication technique used for (i) and/or (ii) is determined based on the total number of holes in the second zone.

16. The method of claim 12, wherein the adjusting of the gas permeability of the gas distribution member comprises:
    determining the difference between a desired total gas flow and the measured total gas flows through each of the zones; and
    at each of the one or more zones, (i) modifying at least one gas injection hole to thereby increase gas flow through the modified gas injection hole and/or (ii) fabricating at least one additional gas injection hole, to thereby adjust the gas permeability of the one or more zones.

17. The method of claim 16, wherein the fabrication technique used for (i) and/or (ii) is determined based on the total number of holes in the one or more zones.

* * * * *